(12) United States Patent
Yen et al.

(10) Patent No.: US 11,835,811 B1
(45) Date of Patent: Dec. 5, 2023

(54) HYBRID THERMAL MANAGEMENT FOR LIQUID CRYSTAL ON SILICON HEAD-UP DISPLAYS

(71) Applicant: GM GLOBAL TECHNOLOGY OPERATIONS LLC, Detroit, MI (US)

(72) Inventors: Chih-hung Yen, Bloomfield Hills, MI (US); Bahram Khalighi, Holladay, UT (US); Taeyoung Han, Troy, MI (US); Shailendra Kaushik, Novi, MI (US); Thomas A. Seder, Fraser, MI (US); Kuo-huey Chen, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/874,413

(22) Filed: Jul. 27, 2022

(51) Int. Cl.
*G02F 1/1333* (2006.01)
*G02B 27/01* (2006.01)
*G02F 1/1362* (2006.01)
*B60K 35/00* (2006.01)
*H05K 7/20* (2006.01)

(52) U.S. Cl.
CPC ........ *G02F 1/133385* (2013.01); *B60K 35/00* (2013.01); *G02B 27/0101* (2013.01); *G02F 1/136277* (2013.01); *H05K 7/20963* (2013.01); *B60K 2370/1529* (2019.05); *B60K 2370/33* (2019.05); *H05K 7/2099* (2013.01)

(58) Field of Classification Search
CPC .............. G02B 27/0101; G02B 27/017; G02B 2027/0118; G02B 2027/012; G02B 2027/0121; G02B 2027/015; G02B 27/283; G02B 2027/0112; B60R 2300/205; G03B 21/604; H05K 7/2099; H05K 7/20963; B60K 2370/33; B60K 35/00; G02F 1/133385
See application file for complete search history.

(56) References Cited

U.S. PATENT DOCUMENTS

| | | | |
|---|---|---|---|
| 2007/0103646 A1* | 5/2007 | Young ................ | G03B 21/206 353/69 |
| 2018/0284497 A1* | 10/2018 | Hosseini .......... | G02F 1/133528 |
| 2020/0341264 A1* | 10/2020 | Falk .................. | G02B 6/02033 |
| 2022/0136406 A1* | 5/2022 | Graham .............. | G09B 19/003 60/39.091 |

* cited by examiner

*Primary Examiner* — Mariam Qureshi
(74) *Attorney, Agent, or Firm* — CANTOR COLBURN LLP

(57) ABSTRACT

Aspects of the disclosure include hybrid thermal management systems configured to control an operating temperature of a liquid crystal on silicon (LCoS) based head-up display (HUD) unit. An exemplary thermal management system can include a liquid crystal on silicon layer and a phase change material on a surface of the liquid crystal on silicon layer. A thermoelectric device is positioned in direct contact with the phase change material and a heat sink is positioned on a surface of the thermoelectric device. The thermal management system can further include a controller configured to adjust a thermoelectric device current of the thermoelectric device responsive to a temperature of the liquid crystal on silicon layer.

20 Claims, 7 Drawing Sheets

HYBRID THERMAL MANAGEMENT FOR LIQUID CRYSTAL ON SILICON HEAD-UP DISPLAYS

INTRODUCTION

The subject disclosure relates to display technologies, and particularly to hybrid thermal management solutions for a liquid crystal on silicon (LCoS) device in a head-up display (HUD) unit.

A HUD unit projects light from an image source onto a viewing surface, such as a windshield of a vehicle, to display a virtual image or display image on the viewing surface. While the image source can vary, liquid crystal on silicon-based devices (also referred to as liquid crystal displays) are often selected for this purpose. In the transmissive LCoS-based configuration, illumination light from a backlight passes through a liquid crystal display as display light, and the display light is reflected by a reflecting mirror (or a concave mirror) of the HUD unit to the viewing surface. Reflective LCoS-based configurations are also possible. By projecting the reflected light onto the viewing surface (e.g., a windshield), a user (e.g., a driver) can quickly and visually recognize a virtual image projected thereon. LCoS-based HUD units can be leveraged to provide drivers and passengers with a range of visual information without substantially moving or obscuring their field of view.

SUMMARY

In one exemplary embodiment a hybrid thermal management system for a liquid crystal on silicon (LCoS) device in a head-up display (HUD) unit includes a liquid crystal on silicon layer and a phase change material on a surface of the liquid crystal on silicon layer. A thermoelectric device is positioned in direct contact with the phase change material and a heat sink is positioned on a surface of the thermoelectric device. The thermal management system can further include a controller configured to adjust a thermoelectric device current of the thermoelectric device responsive to a temperature of the liquid crystal on silicon layer.

In some embodiments, the liquid crystal on silicon device is a liquid crystal display in a head-up display unit.

In another embodiment, the thermoelectric device is positioned on a top surface of the phase change material. In some embodiments, the phase change material is conformally molded onto a surface of the thermoelectric device.

In some embodiments, the hybrid thermal management system includes a thermocouple configured to measure the temperature of the liquid crystal on silicon layer. In some embodiments, the controller is communicatively coupled to the thermocouple.

In addition to one or more of the features described herein, adjusting the thermoelectric device current of the thermoelectric device can include determining that the temperature is greater than a high temperature threshold and adjusting the thermoelectric device current to achieve a normalized current within a net cooling region of a net heating and net cooling curve of the thermoelectric device. In still other embodiments, adjusting the thermoelectric device current of the thermoelectric device can include determining that the temperature is lower than a low temperature threshold and adjusting the thermoelectric device current to achieve a normalized current within a net heating region of a net heating and net cooling curve of the thermoelectric device.

In some embodiments, the phase change material includes a phase change composite material. In some embodiments, the phase change composite material includes expanded graphite embedded with paraffins.

In another exemplary embodiment, a method includes forming a liquid crystal on silicon layer and forming a phase change material on a surface of the liquid crystal on silicon layer. The method further includes forming a thermoelectric device in direct contact with the phase change material and forming a heat sink on a surface of the thermoelectric device. The method can further include providing a controller configured to adjust a thermoelectric device current of the thermoelectric device responsive to a temperature of the liquid crystal on silicon layer.

In some embodiments, the liquid crystal on silicon layer includes a liquid crystal display in a head-up display unit.

In yet another exemplary embodiment, a display system for a vehicle includes a HUD unit configured to project display light onto a viewing surface of the vehicle. The display system further includes a thermal management system for the HUD unit. The thermal management system can include a liquid crystal on silicon layer and a phase change material on a surface of the liquid crystal on silicon layer. The thermal management system can further include a thermoelectric device in direct contact with the phase change material, a heat sink on a surface of the thermoelectric device, and a controller configured to adjust a thermoelectric device current of the thermoelectric device responsive to a temperature of the liquid crystal on silicon layer.

In some embodiments, the viewing surface is a glass panel (e.g., front windshield, window, etc.) of the vehicle.

In some embodiments, the thermoelectric device is positioned on a top surface of the phase change material. In some embodiments, the phase change material is conformally molded onto a surface of the thermoelectric device.

In some embodiments, the thermal management system further includes a thermocouple configured to measure the temperature of the liquid crystal on silicon layer. The thermocouple can be communicatively coupled to the controller.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1A:
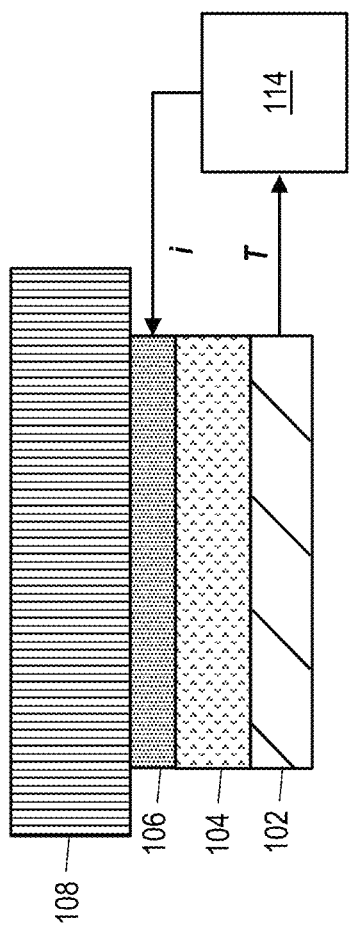
FIG. 1A depicts a cross-sectional view of a hybrid thermal management system for a liquid crystal on silicon (LCoS) device in a head-up display (HUD) unit formed according to one or more embodiments.

The following description is merely exemplary in nature and is not intended to limit the present disclosure, its application or uses. It should be understood that throughout the drawings, corresponding reference numerals indicate like or corresponding parts and features. As used herein, the term module refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

The continued development of sophisticated head up displays (HUDs), smart glass applications, in-plane displays, and general device displays is necessary to meet the ever-increasing demands and expectations of consumers, particularly in the competitive automotive industry. To enhance the driver experience, improved displays are being developed that can be seamlessly integrated within any of a vehicle's glass panels (e.g., front windshield, side mirrors, etc.). Liquid crystal on silicon (LCoS) based HUD units, for example, can be leveraged to project virtual images onto a glass panel, providing drivers and passengers with a range of visual information without substantially moving or obscuring their field of view.

Challenges remain, however, in the development and manufacture of LCoS-based HUD units. One such challenge is inherent to the combination of an LCoS-based display with a HUD unit; namely, that the HUD unit will be exposed to a range of hot and cold environments due to its location on a glass panel (e.g., front windshield) of a vehicle. Unfortunately, the performance of LCoS-based displays deteriorates when the operating temperature is either too hot or too cold. The optimal temperature is about 70° C. Complicating matters further, active liquid cooling is impractical for HUD units due to size and energy constraints.

This disclosure introduces a quasi-passive way to efficiently control the operation environment, and specifically, the operating temperature, of a LCoS-based HUD unit. Advantageously, aspects of the disclosure can maintain a target operating temperature for an LCoS display across a wide range of expected environmental conditions (e.g., temperatures ranging from negative 20 Celsius to 60 Celsius). Maintaining an optimal operating temperature for an LCoS display in accordance with one or more embodiments greatly improves the operational performance and efficiency of an LCoS-based HUD unit.

In some embodiments, the operating environment of the LCoS display is controlled using a hybrid thermal management solution that combines a thermoelectric device (TED) and a phase change material (PCM). The TED and PCM work together to maintain the target operating condition, ensuring optimal display performance. In some embodiments, the TED and PCM are layered between the LCoS display and a heat sink to define a single hybrid thermal management device. Integrating the TED and PCM in this manner advantageously enables a single hybrid device (having both the TED and PCM) that can serve as both a heater and a cooler by adjusting the device current of the TED. In other words, net heating or cooling can be controlled by current adjusting.

In some embodiments, the hybrid thermal management device utilizes the energy storage capabilities of PCMs to complement the thermoelectric cooling effects of the TED, allowing one to meet thermal management requirements with a less powerful, less energy consuming, smaller size TED.

Although aspects of the disclosure are described in the context of a LCoS display integrated within a HUD unit, it should be readily understood that the hybrid thermal management solutions described herein can be applied to any display type, such as, for example, within in-plane displays (e.g., an in-plane communication device laminated in or on a vehicle window to communicate with users inside or outside the vehicle), smart glass applications, and general LCoS-based device displays.

FIG. 1A illustrates a cross-sectional view of a hybrid thermal management system 100 for a liquid crystal on silicon (LCoS) device in a head-up display (HUD) unit (not separately shown) formed according to one or more embodiments. As shown in FIG. 1A, the hybrid thermal management system 100 includes an LCoS layer 102 and a phase change material (PCM) 104 formed on a surface of the LCoS layer 102. The LCoS layer 102 is sometimes referred to as an LCoS backplane (or simply, a backplane).

While not meant to be particularly limited, the LCoS layer 102 can include any of a range of known liquid crystal display material(s), such as, for example, semiconductor materials (e.g., silicon, gallium nitride, indium gallium nitride, etc.) configured accordingly (e.g., as a display backplane). For example, the LCoS layer 102 can include a plurality of CMOS switches and dual storage pixel arrays (not separately shown), although other LCoS backplane configurations are within the contemplated scope of the disclosure. In some embodiments, the LCoS layer 102 includes several stacked layers, such as an indium gallium nitride/gallium nitride (InGaN/Gan) stack formed on a silicon or sapphire substrate (not separately shown). The LCoS layer 102 can include electrical connections (not separately shown) configured to individually control each of a plurality of underlying pixels using electrical signals (i.e., by passing a voltage to a respective display element).

The PCM 104 can be made from known phase-change materials, for example, phase-change composite materials (PCCMs) such as expanded graphite with and without embedded paraffins. The specific phase-change material selected for a given application is not meant to be particularly limited. Other phase-change materials, including organic PCMs (e.g., hydrocarbons such as paraffins, lipids, sugar alcohols, etc.), inorganic PCMs (e.g., salt hydrates), and other materials which absorb or release large amounts of latent heat during phase transitions, are within the contemplated scope of the disclosure.

As further shown in FIG. 1A, a thermoelectric device (TED) 106 is formed on a surface of the PCM 104. Thermoelectric devices leverage the Peltier effect to transfer heat between a main surface (or hot side) and a waste surface (or cold side) in response to a received current. The particular configuration of the TED 106 in a given application is not meant to be particularly limited, and can include, for example, an alternating array of n- and p-type semiconductors (e.g., bismuth telluride, antimony telluride, lead telluride, bismuth selenide, etc.) having complementary Peltier coefficients soldered or otherwise fixed between a pair of plates (e.g., ceramic plates, metal plates, etc.).

Figure 1B:
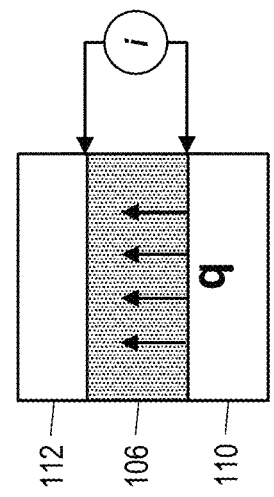
FIG. 1B depicts a cross-sectional view of a thermoelectric device in accordance with one or more embodiments.

In some embodiments, the TED 106 is configured to transfer thermal energy between the LCoS layer 102 (i.e., the hot side) and a heat sink 108 (i.e., the cold side) upon the application of electric current. The working principle of a thermoelectric device is shown in FIG. 1B. As illustrated in FIG. 1B, a TED 106 transfers heat "q" from a hot side 110 to a cold side 112 in response to a difference in current "i" applied at opposite ends of the TED 106.

The heat sink 108 can be made from any suitable material, such as, for example, metals and metal alloys having high or very high thermal conductivities (e.g., aluminum, copper, and alloys thereof), although more exotic materials, such as thermal interface materials, are within the contemplated scope of the disclosure. The heat sink 108 can include, for example, a bulk body and one or more heat dissipating fins, although other configurations are within the contemplated scope of the disclosure.

As further shown in FIG. 1A, the hybrid thermal management system 100 can include a controller 114. In some embodiments, the controller 114 is communicatively coupled to a thermocouple (not separately shown) positioned in, on, or adjacent the LCoS layer 102. In some embodiments, the thermocouple measures the temperature of the LCoS layer 102 and sends this signal ('T' in FIG. 1A) to the controller 114. The thermocouple can include a pair of materials (e.g., metals) that are joined together, or coupled, for measuring heat. Thermocouples are widely used in a variety of industries due to their accuracy and large operating range of temperatures. Metals used in thermocouples include iron, nickel, copper, chromium, aluminum, platinum, rhodium, and their alloys.

Figure 4:
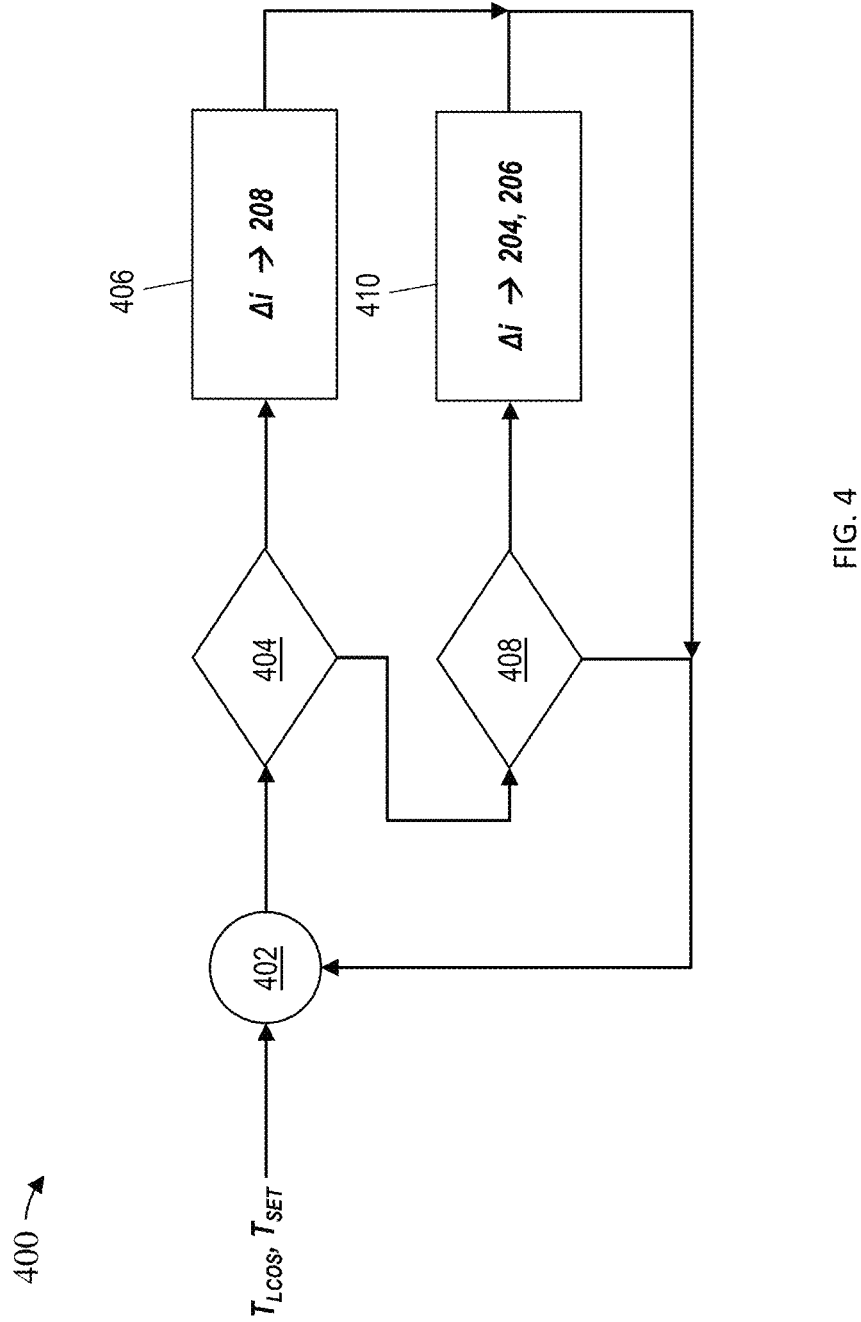
FIG. 4 depicts a block diagram of temperature control logic for thermal management systems according to one or more embodiments.

In some embodiments, the controller 114 is configured with temperature control logic (see, e.g., FIG. 4). In some embodiments, the controller 114 is configured to initiate heating or cooling measures for the LCoS layer 102 based on the signal "T" and the temperature control logic. The temperature control logic is discussed in greater detail with respect to FIG. 4. In some embodiments, the controller 114 is configured to send a control signal to the TED 106. In some embodiments, the control signal is a current ("i" in FIG. 1A, sometimes referred to as a thermoelectric device current) applied to one end of the TED 106, thereby effecting a net heating or net cooling of the LCoS layer 102 due to the Peltier effect.

The hybrid thermal management system 100 is shown having a particular arrangement (e.g., TED on PCM) for ease of discussion and illustration only. It should be understood, however, that the configuration of the LCoS layer 102, the PCM 104, the TED 106, and the head sink 108 can vary as required for a given display application. For example, in some embodiments, the relative positions of the PCM 104 and the TED 106 are swapped (also referred to as a PCM on TED configuration, not separately shown). In other embodiments, one or both of the PCM 104 and the TED 106 are wholly or partially positioned (as a single continuous structure or as two or more separate structures) on the opposite surface of the LCoS layer 102 (not separately shown).

Figure 2:
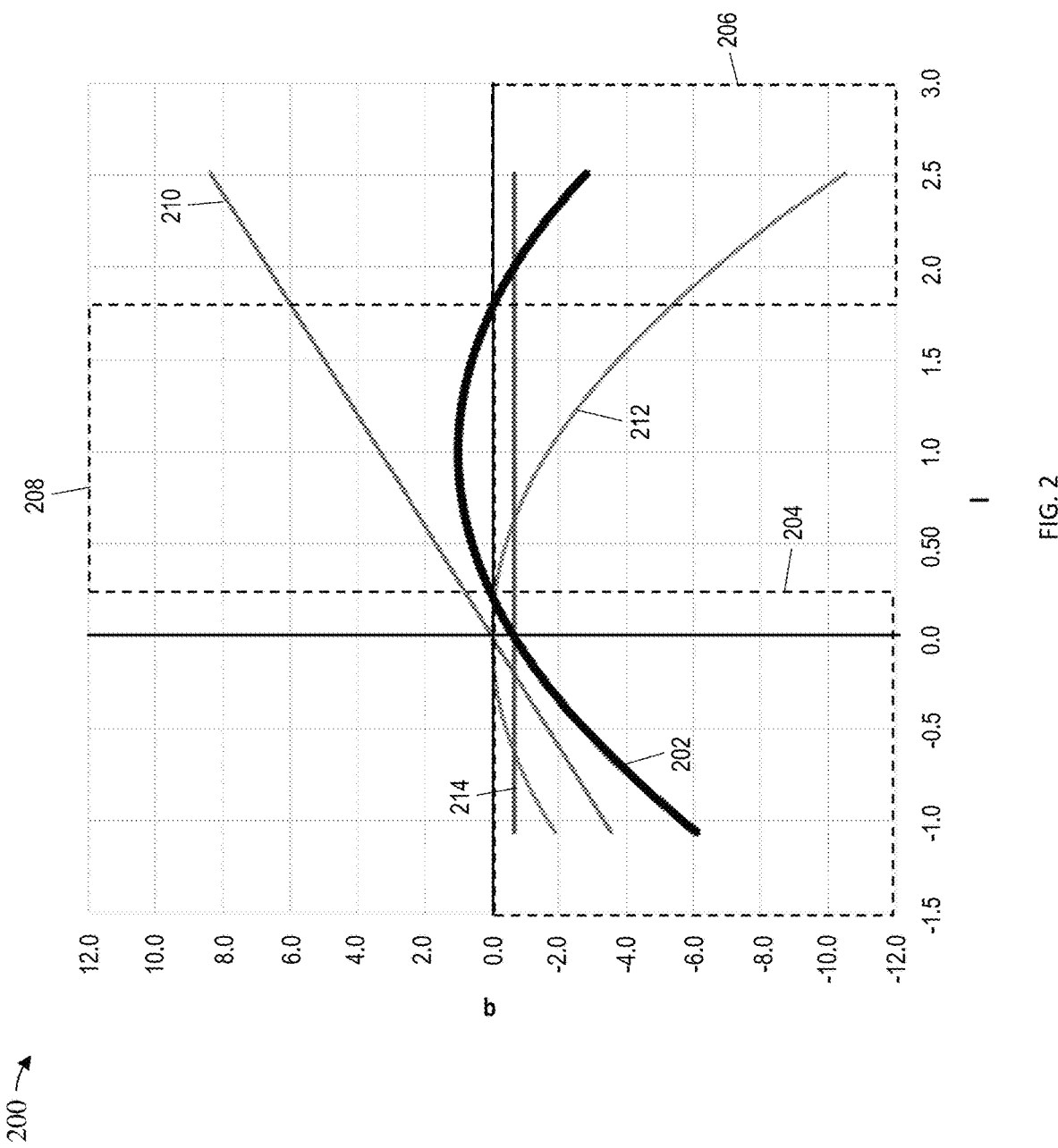
FIG. 2 depicts net heating and net cooling curves for a hybrid thermal management system configured in accordance with one or more embodiments.

FIG. 2 depicts net heating and net cooling curves 200 for a hybrid thermal management system 100 configured in accordance with one or more embodiments. As explained previously, the hybrid thermal management system 100 includes a PCM 104 and a TED 106 that cooperatively serve as a dual heating and cooling system for the LCoS layer 102. The thermal management curve 202 describes the overall relationship between heat absorption "q" (see FIG. 1B) and the thermoelectric device current "I" for the TED 106 (see FIG. 1A). In particular, the y-axis depicts a normalized heat absorption "q" (i.e., $q/q_{MAx}$, shown between −12.0 and 12.0, where $q_{MAX}$ is the maximum heat absorption for the respective application) and the x-axis depicts a normalized current (i.e., $I/I_{MAx}$, shown between −1.5 and 3.0, where $I_{MAX}$ is the maximum thermoelectric device current for the respective application). Negative "q" values denote net heating regions 204 and 206, while positive "q" values denote the net cooling region 208.

The thermal management curve 202 is the net effect of three primary underlying mechanisms: Peltier heat absorption, joule heating, and conduction. In particular, the overall relationship between heat absorption and current is described by the formula (1):

$$Q_c = \alpha I T_c - \frac{1}{2} I^2 R - K \Delta T_p \tag{1}$$

where $Q_c$ is overall heat absorption (or dissipation), $\alpha I T_c$ describes cooling (heat absorption) due to the Peltier effect, $(\frac{1}{2})I^2 R$ describes joule heating due to overcoming the electric resistance in the TED 106, and $K \Delta T_p$ is heat flow by conduction.

The Peltier cooling curve 210 illustrates the overall heat transfer contribution of Peltier heat absorption as a function of the thermoelectric device current "I". The joule heating curve 212 illustrates the overall heat transfer contribution of joule heating as a function of the thermoelectric device current "I". The conduction curve 214 illustrates the overall heat transfer contribution of conduction as a function of the thermoelectric device current "I".

As shown in FIG. 2, both net heating and net cooling of the LCoS layer 102 can be achieved by changing the thermoelectric device current I. By observation, in some embodiments, net heating is achieved at normalized thermoelectric device currents of negative 1.5 to 0.25 and 1.75 to 3.0, while net cooling is achieved at normalized thermoelectric device currents between 0.25 and 1.75.

Figure 3:
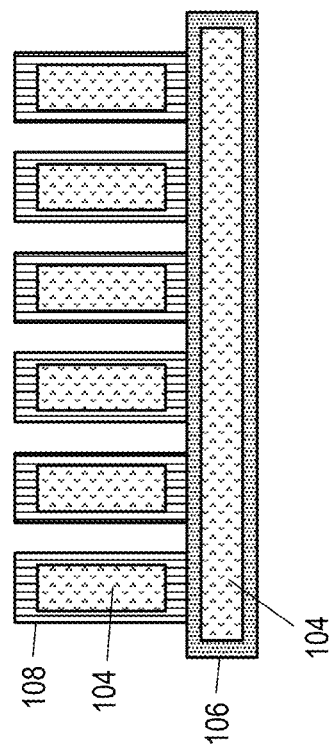
FIG. 3 depicts a cross-sectional view of a thermal management system having conformal phase-change materials according to one or more embodiments.

FIG. 3 depicts a cross-sectional view of an embodiment of a thermal management system 100 having a conformal PCM 104. The thermal management system 100 depicted in FIG. 3 can be otherwise configured in a similar manner and from similar materials as the embodiment of the thermal management system 100 shown in FIG. 1A. The LCoS layer 102 (FIG. 1A) is omitted for clarity but will be present in the final device.

In some embodiments, the conformal PCM 104 includes PCCMs that are conformally molded onto surfaces of one or both of the TED 106 and the heat sink 108. The conformal PCM 104 can be formed to any desired nominal (average) thickness, such as, for example, to a nominal thickness of 0.5 mm to several inches, depending on the size and configuration of the TED 106 and the heat sink 108. Advantagiously, conformally molding the PCM 104 to the TED 106 and/or heat sink 108 in this manner allows for an increase in phase-change material volume without increasing the overall size of the thermal management system 100.

In some embodiments, the latent heat of fusion of the PCM 104 is leveraged to maintain a desired LCoS layer 102 temperature range without requiring current at the TED 106 (or alternatively, while requiring a relatively lower current than would be required without the use of phase-change materials). In particular, the heat of fusion for phase-change materials can be leveraged to dampen thermal load spikes (e.g., rapid increases in environmental temperature, such as when a vehicle moves from a garage into sunlight). In other words, the PCM 104 serves to flatten out thermal loads, as the PCM 104 can absorb a large amount of heat before undergoing a phase transition. While discussed in the context of the latent heat of fusion, other phase-change materials and configurations leveraging the latent heat of vaporization as possible as well and are within the contemplated scope of the disclosure.

FIG. 4 depicts a block diagram of temperature control logic 400 for a thermal management system configured in accordance with one or more embodiments. In some embodiments, a controller (e.g., the controller 114 of FIG. 1A) is configured to evaluate the temperature control logic 400 to maintain a target temperature for a liquid crystal display (e.g., the LCoS layer 102 of FIG. 1A).

At block 402, the current temperature of the liquid crystal display ("$T_{Lcos}$") is compared to a target temperature ("$T_{SET}$"). The current temperature can be measured using any suitable device or technique, such as, for example, by a thermocouple (not separately shown) positioned in, on, or adjacent the LCoS layer 102.

At block 404, a high temperature check is evaluated. In some embodiments, the high temperature check is evaluated by determining if $T_{Lcos}$ is higher than $T_{SET}$ (i.e., if $T_{Lcos}-T_{SET}>0$). If the high temperature check evaluates as true, the temperature control logic 400 proceeds to block 406 and cooling measures are initiated. In some embodiments, cooling measures can include changing the thermoelectric device current of the TED 106 according to the net heating and net cooling curves 200 to reach the net cooling region 208 (i.e., "Δi→208"). For example, if the normalized current is at −1.0, the current can be increased to 1.0 (or any number between about 0.25 and 1.75 associated with the net cooling region 208 as shown in FIG. 2). In another example, if the normalized current is at 2.5, the current can be decrease to 1.0 (or any number between about 0.25 and 1.75 associated with the net cooling region 208 as shown in FIG. 2).

Observe that comparing $T_{Lcos}$ against $T_{SET}$ requires strict adherence to the target temperatures (i.e., any deviation above $T_{SET}$ results in cooling measures). To provide some thermal flexibility, in some embodiments, the high temperature check is alternatively evaluated against a high temperature threshold ("$T_{HIGH}$") (i.e., if $T_{Lcos}-T_{HIGH}>0$). $T_{HIGH}$ can be set to any temperature above $T_{SET}$. For example, if $T_{SET}$ is 70 degrees Celsius, $T_{HIGH}$ can be 72 degrees Celsius. In this manner the aggressiveness of the cooling measures can be finely tuned as desired depending on the needs of a particular application.

If the high temperature check at block 404 evaluates as false, the temperature control logic 400 proceeds to block 408 and a low temperature check is evaluated.

In some embodiments, the low temperature check is evaluated by determining if $T_{Lcos}$ is lower than $T_{SET}$ (i.e., if $T_{Lcos}-T_{SET}<0$). If the low temperature check evaluates as true, the temperature control logic 400 proceeds to block 410 and heating measures are initiated. In some embodiments, heating measures can include changing the thermoelectric device current of the TED 106 according to the net heating and net cooling curves 200 to reach one of the net heating regions 204, 206 (i.e., "Δi→204, 206"). For example, if the normalized current is at 0.5, the current can be decreased to −0.5 (or to any number between about −1.5 and 0.25 associated with the net heating region 204 as shown in FIG. 2). Alternatively, the current can be increased to 2.5 (or to any number between about 1.75 and 3.0 associated with the net heating region 206 as shown in FIG. 2). In some embodiments, increasing or decreasing the current is preferentially made in the direction of the nearest of the net heating regions 204, 206. In some embodiments, increasing or decreasing the current is preferentially made in the direction of the region of the net heating regions 204, 206 which minimizing energy use.

Observe again that comparing $T_{LCOS}$ against $T_{SET}$ requires strict adherence to the target temperatures (i.e., any deviation below $T_{SET}$ results in heating measures). To provide some thermal flexibility, in some embodiments, the low temperature check is alternatively evaluated against a low temperature threshold ("$T_{LOW}$") (i.e., if $T_{Lcos}-T_{LOW}<0$). $T_{LOW}$ can be set to any temperature below $T_{SET}$. For example, if $T_{SET}$ is 70 degrees Celsius, $T_{LOW}$ can be 68 degrees Celsius. In this manner the aggressiveness of the heating measures can be finely tuned as desired depending on the needs of a particular application.

If $T_{LCOS}$ is between $T_{HIGH}$ and $T_{LOW}$ (or at $T_{SET}$ in the strict case) no heating or cooling is needed. The temperature control logic 400 returns to block 402 and a new current temperature is evaluated. Similarly, after the heating measures at block 406 and the cooling measures at block 410 are completed, the temperature control logic 400 returns to block 402 and a new current temperature is evaluated. In some embodiments, a predetermined delay must elapse before a new current temperature is evaluated.

Figure 5:
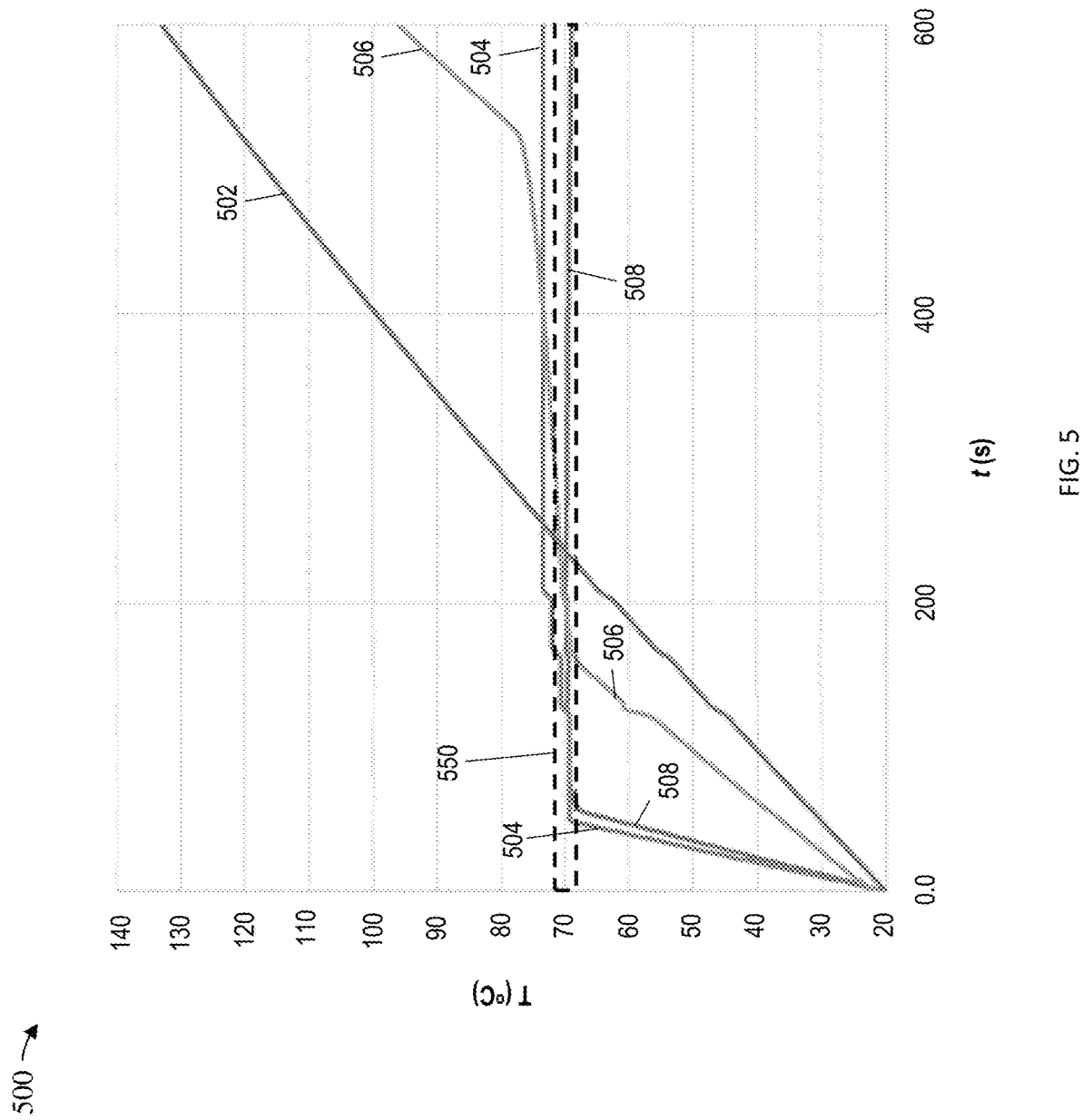
FIG. 5 depicts a series of comparative temperature response curves for LCoS-based HUD units having a range of thermal management systems in accordance with one or more embodiments.

FIG. 5 depicts a series of comparative temperature response curves 500 for LCoS-based HUD units having a range of thermal management systems in accordance with one or more embodiments. The comparative temperature response curves 500 each describe the relationship between temperature "T" (e.g., $T_{Lcos}$ in FIG. 4) and elapsed time "t" for a liquid crystal display exposed to a thermal load. Temperature response curve 502 illustrates the baseline temperature response for a liquid crystal display in a HUD unit without the use of phase-change materials or a thermoelectric device.

Temperature response curve 504 illustrates the temperature response for a liquid crystal display in a HUD unit with a thermoelectric device, but without the use of phase-change materials. Observe that the overall temperature response is relatively quicker than the baseline temperature response of the temperature response curve 502. Further observe that the temperature response drifts above the target temperature range 550 (i.e., $T_{SET}$ or between $T_{HIGH}$ and $T_{LOW}$ as discussed previously) after approximately 200 seconds.

Temperature response curve 506 illustrates the temperature response for a liquid crystal display in a HUD unit with phase-change materials, but without the use of a thermoelectric device. Observe that the overall temperature response is relatively quicker than the baseline temperature response of the temperature response curve 502, but relatively slower than measured for the temperature response curve 504 (TED only). Further observe that the temperature response eventually fails to hold the temperature within the target temperature range 550. For example, temperatures rapidly increase after approximately 500 seconds. This period of time corresponds to the thermal saturation of the phase-change material and to the transition from a latent heat of fusion regime to the sensible heating of a (now liquid) phase-change material.

Temperature response curve 508 illustrates the temperature response for a liquid crystal display in a HUD unit with both a thermoelectric device and phase-change materials. Observe that the overall temperature response is relatively quicker than the baseline temperature response of the temperature response curve 502. Further observe that the temperature response maintains the target temperature range 550 throughout the entirety of the thermal load test (e.g., over 600 seconds).

Figure 6:
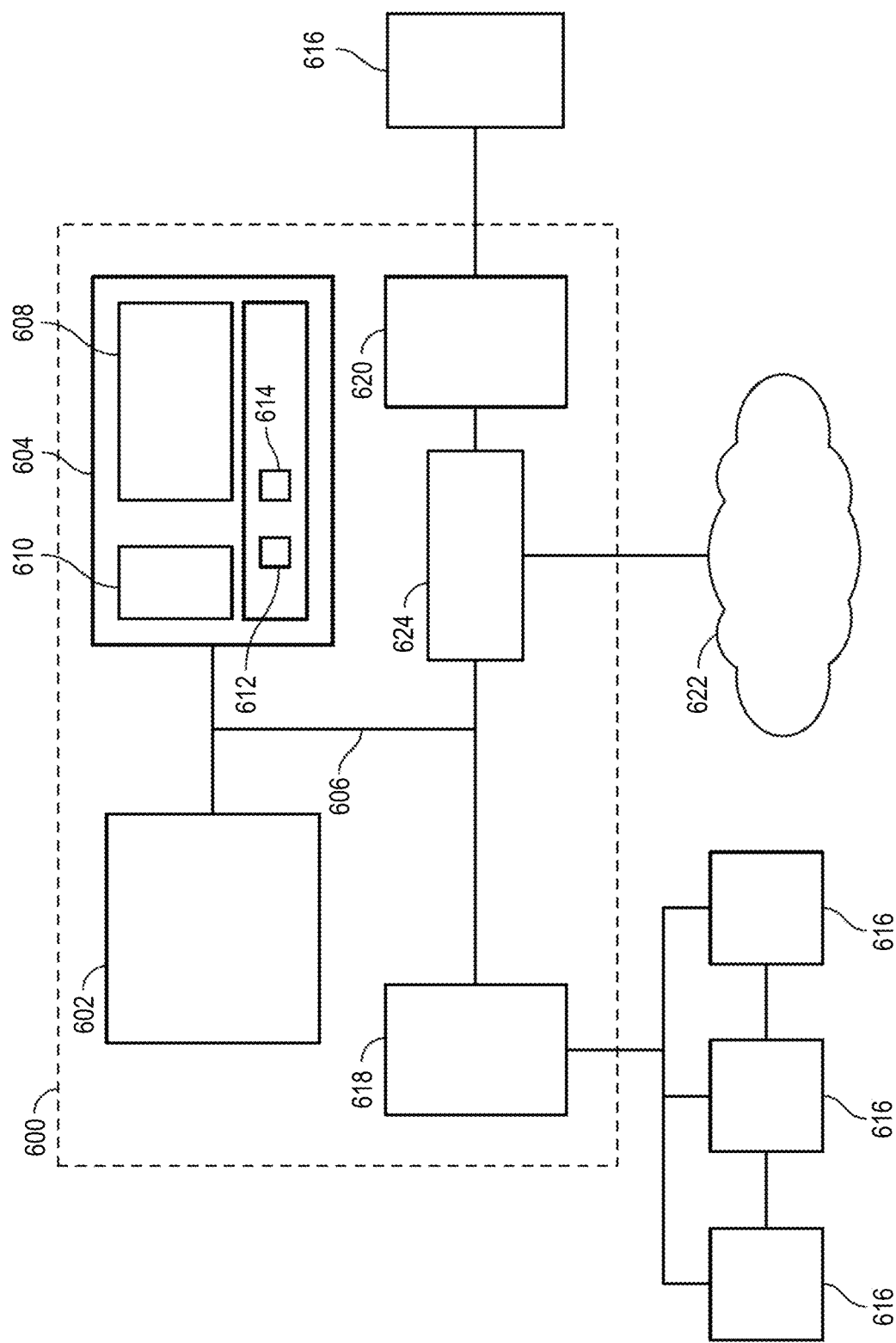
FIG. 6 is a computer system according to one or more embodiments.

FIG. 6 illustrates aspects of an embodiment of a computer system 600 that can perform various aspects of embodiments described herein. In some embodiments, the computer system 600 can be incorporated within or in combination with a LCoS-based HUD unit (e.g., a hybrid thermal management system 100). The computer system 600 includes at least one processing device 602, which generally includes one or more processors (e.g., the controller 114 of FIG. 1A) for performing a variety of functions, such as, for example, controlling the thermoelectric device current at the TED 106. More specifically, the computer system 600 can include temperature control logic 400 (as shown, e.g., in FIG. 4) necessary to initiate heating or cooling measures by adjusting the thermoelectric device current.

Components of the computer system 600 include the processing device 602 (such as one or more processors or processing units), a system memory 604, and a bus 606 that couples various system components including the system memory 604 to the processing device 602. The system memory 604 may include a variety of computer system readable media. Such media can be any available media that is accessible by the processing device 602, and includes both volatile and non-volatile media, and removable and non-removable media.

For example, the system memory 604 includes a non-volatile memory 608 such as a hard drive, and may also include a volatile memory 610, such as random access memory (RAM) and/or cache memory. The computer system 600 can further include other removable/non-removable, volatile/non-volatile computer system storage media.

The system memory 604 can include at least one program product having a set (e.g., at least one) of program modules that are configured to carry out functions of the embodiments described herein. For example, the system memory 604 stores various program modules that generally carry out the functions and/or methodologies of embodiments described herein. A module or modules 612, 614 may be included to perform functions related to control of the hybrid thermal management system 100, such as, for example, comparing a current LCoS display temperature (as measured using, e.g., a thermocouple) to a target temperature (i.e., a setpoint such as 70 degrees Celsius) or threshold (i.e., a high/low threshold banding the target temperature), and adjusting a current sent to the TED (e.g., the TED 106). The computer system 600 is not so limited, as other modules may be included depending on the desired functionality of the respective displays. As used herein, the term "module" refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality. For example, the module(s) can be configured via software, hardware, and/or firmware to maintain a target temperature for a liquid crystal display (e.g., the LCoS layer 102 of FIG. 1A) according to one or more embodiments.

The processing device 602 can also be configured to communicate with one or more external devices 616 such as, for example, a keyboard, a pointing device, and/or any devices (e.g., a network card, a modem, vehicle ECUs, etc.) that enable the processing device 602 to communicate with one or more other computing devices. Communication with various devices can occur via Input/Output (I/O) interfaces 618 and 620.

The processing device 602 may also communicate with one or more networks 622 such as a local area network (LAN), a general wide area network (WAN), a bus network and/or a public network (e.g., the Internet) via a network adapter 624. In some embodiments, the network adapter 624 is or includes an optical network adaptor for communication over an optical network. It should be understood that although not shown, other hardware and/or software components may be used in conjunction with the computer system 600. Examples include, but are not limited to, microcode, device drivers, redundant processing units, external disk drive arrays, RAID systems, and data archival storage systems, etc.

Figure 7:
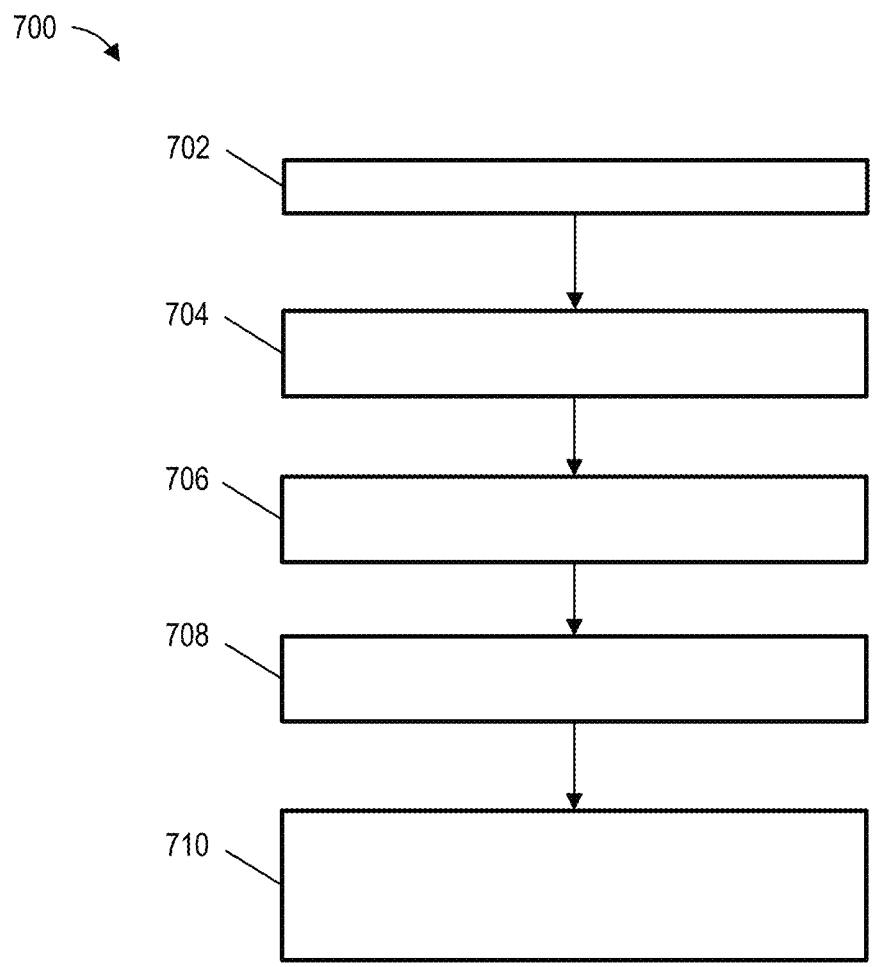
FIG. 7 is a flowchart in accordance with one or more embodiments.

Referring now to FIG. 7, a flowchart 700 for leveraging a hybrid thermal management system to control an operating temperature of a LCoS-based HUD unit is generally shown according to an embodiment. The flowchart 700 is described in reference to FIGS. 1A to 6 and may include additional steps not depicted in FIG. 7. Although depicted in a particular order, the blocks depicted in FIG. 7 can be rearranged, subdivided, and/or combined.

At block 702, a liquid crystal on silicon layer is formed. In some embodiments, the liquid crystal on silicon layer includes a liquid crystal display in a head-up display unit.

At block 704, a phase change material is formed on a surface of the liquid crystal on silicon layer. In some embodiments, the phase change material includes a phase change composite material (PCCM). In some embodiments, the PCCM includes expanded graphite embedded with paraffins.

At block 706, a thermoelectric device is formed in direct contact with the phase change material. In some embodiments, the thermoelectric device is formed or otherwise positioned on a top surface of the phase change material. In some embodiments, the phase change material is conformally molded onto a surface of the thermoelectric device.

At block 708, a heat sink is formed on a surface of the thermoelectric device. In some embodiments, the heat sink is an aluminum heat sink having one or more fins.

At block 710, a controller configured to adjust a thermoelectric device current of the thermoelectric device responsive to a temperature of the liquid crystal on silicon layer is provided. In some embodiments, a thermocouple is configured to measure the temperature of the liquid crystal on silicon layer. In some embodiments, the controller is communicatively coupled to the thermocouple.

In some embodiments, adjusting the thermoelectric device current of the thermoelectric device includes determining that the temperature is greater than a high temperature threshold and adjusting the thermoelectric device current to achieve a normalized current within a net cooling region of a net heating and net cooling curve of the thermoelectric device.

In some embodiments, adjusting the thermoelectric device current of the thermoelectric device includes determining that the temperature is lower than a low temperature threshold and adjusting the thermoelectric device current to achieve a normalized current within a net heating region of a net heating and net cooling curve of the thermoelectric device.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof

What is claimed is:

1. A thermal management system for a liquid crystal on silicon device, the thermal management system comprising:
   a liquid crystal on silicon layer;
   a phase change material on a surface of the liquid crystal on silicon layer;
   a thermoelectric device in direct contact with the phase change material;
   a heat sink on a surface of the thermoelectric device; and
   a controller configured to adjust a thermoelectric device current of the thermoelectric device responsive to a temperature of the liquid crystal on silicon layer.

2. The system of claim 1, wherein the liquid crystal on silicon device comprises a liquid crystal display in a head-up display unit.

3. The system of claim 1, wherein the thermoelectric device is on a top surface of the phase change material.

4. The system of claim 1, wherein the phase change material is conformally molded onto a surface of the thermoelectric device.

5. The system of claim 1, further comprising a thermocouple configured to measure the temperature of the liquid crystal on silicon layer.

6. The system of claim 5, wherein the controller is communicatively coupled to the thermocouple.

7. The system of claim 1, wherein adjusting the thermoelectric device current of the thermoelectric device comprises:
   determining that the temperature is greater than a high temperature threshold; and
   adjusting the thermoelectric device current to achieve a normalized current within a net cooling region of a net heating and net cooling curve of the thermoelectric device.

8. The system of claim 1, wherein adjusting the thermoelectric device current of the thermoelectric device comprises:
   determining that the temperature is lower than a low temperature threshold; and
   adjusting the thermoelectric device current to achieve a normalized current within a net heating region of a net heating and net cooling curve of the thermoelectric device.

9. The system of claim 1, wherein the phase change material comprises a phase change composite material.

10. The system of claim 9, wherein the phase change composite material comprises expanded graphite embedded with paraffins.

11. A method comprising:
    forming a liquid crystal on silicon layer;
    forming a phase change material on a surface of the liquid crystal on silicon layer;
    forming a thermoelectric device in direct contact with the phase change material;
    forming a heat sink on a surface of the thermoelectric device; and
    providing a controller configured to adjust a thermoelectric device current of the thermoelectric device responsive to a temperature of the liquid crystal on silicon layer.

12. The method of claim 11, wherein the liquid crystal on silicon layer comprises a liquid crystal display in a head-up display unit.

13. The method of claim 11, wherein the thermoelectric device is on a top surface of the phase change material.

14. The method of claim 11, wherein adjusting the thermoelectric device current of the thermoelectric device comprises:
    determining that the temperature is greater than a high temperature threshold; and
    adjusting the thermoelectric device current to achieve a normalized current within a net cooling region of a net heating and net cooling curve of the thermoelectric device.

15. The method of claim 11, wherein adjusting the thermoelectric device current of the thermoelectric device comprises:
    determining that the temperature is lower than a low temperature threshold; and
    adjusting the thermoelectric device current to achieve a normalized current within a net heating region of a net heating and net cooling curve of the thermoelectric device.

16. A display system for a vehicle, the display system comprising:
    a head-up display (HUD) unit configured to project display light onto a viewing surface of the vehicle; and
    a thermal management system for the HUD unit, the thermal management system comprising:
      a liquid crystal on silicon layer;
      a phase change material on a surface of the liquid crystal on silicon layer;
      a thermoelectric device in direct contact with the phase change material;
      a heat sink on a surface of the thermoelectric device; and
      a controller configured to adjust a thermoelectric device current of the thermoelectric device responsive to a temperature of the liquid crystal on silicon layer.

17. The display system of claim 16, wherein the viewing surface is a glass panel of the vehicle.

18. The display system of claim 16, wherein the thermoelectric device is on a top surface of the phase change material.

19. The display system of claim 16, wherein the phase change material is conformally molded onto a surface of the thermoelectric device.

20. The display system of claim 16, further comprising a thermocouple configured to measure the temperature of the liquid crystal on silicon layer, the thermocouple communicatively coupled to the controller.

* * * * *